United States Patent [19]
Mori et al.

[11] Patent Number: 5,061,863
[45] Date of Patent: Oct. 29, 1991

[54] TRANSISTOR PROVIDED WITH A CURRENT DETECTING FUNCTION

[75] Inventors: Shogo Mori; Shinobu Aoki; Haruo Takagi, all of Kariya, Japan

[73] Assignee: Kabushiki Kaisha Toyoda Jidoshokki Seisakusho, Kariya, Japan

[21] Appl. No.: 523,215

[22] Filed: May 14, 1990

[30] Foreign Application Priority Data

May 16, 1989 [JP] Japan ................................. 1-121975
Oct. 16, 1989 [JP] Japan ................................. 1-268720
Oct. 27, 1989 [JP] Japan ................................. 1-280778

[51] Int. Cl.⁵ .................... H03K 17/08; H03K 17/14; G01R 19/15
[52] U.S. Cl. ................................ 307/350; 307/299.2; 307/300; 307/310; 307/491; 307/253
[58] Field of Search ............... 307/350, 300, 546, 549, 307/299.2, 491, 303, 253

[56] References Cited

U.S. PATENT DOCUMENTS 4,533,845  8/1985  Bynum et al. .................... 307/299.2
4,961,006 10/1990  Pace et al. ........................ 307/299.2

Primary Examiner—John Zazworsky
Attorney, Agent, or Firm—Brooks Haidt Haffner & Delahunty

[57] ABSTRACT

A transistor provided with a current detecting function does not need any external resistance to detect current but uses a part of the electrode wiring through which main current flows as a resistance to prevent power loss. It detects the magnitude of main current on the basis of voltage drop caused by the resistance. Further, a stable sense voltage can be obtained without being affected by temperature change and sense voltages caused at the both ends of a sense resistance can be maintained constant with temperature change. Sense voltages can accurately correspond to the magnitude of main current flowing through a main transistor to enable excess current to be detected accurately.

21 Claims, 8 Drawing Sheets

TRANSISTOR PROVIDED WITH A CURRENT DETECTING FUNCTION

BACKGROUND OF THE INVENTION

The present invention relates to a transistor provided with a current detecting function for detecting the magnitude of a main current. It can be applied to various kinds of transistors including those of the bipolar, electrostatic induction and field effect types.

The present invention also relates to a transistor provided with a current detecting function, such as a main transistor through which main current flows and a sense transistor for detecting the current flowing through the main transistor, and more particularly to a transistor provided with a current detecting function designed to enable stable sense voltages to be obtained, which are not affected by temperature change.

In one conventional system, a power transistor through which a large amount of current must flow is provided with a current detecting function to prevent it from being damaged by excess current. An external resistance is connected between the main electrodes, such as the emitter and source electrodes, and the voltage drop across this resistance is measured. Thus, the magnitude of the main current is detected. This method, however, requires the addition of an external resistance, thus causing power loss.

In another conventional system, a transistor provided with a sense transistor is connected to the power transistor independently of the main transistor, and to the current detecting emitter terminal. In this system, a resistance (hereinafter referred to as sense resistance) must be located inside the transistor to detect the drop in sense voltage in the current flowing through the sense resistance. Materials such as aluminum, polysilicon, diffusion resistance and the like are used for this sense resistance.

When these materials are used, the sense resistance changes with temperature because they have their own temperature coefficients. Therefore, the sense voltage also changes with temperature.

This problem will be solved if the sense resistance is made independent of temperature change.

However, the resistance (or on-resistance) between the collector and the emitter of a transistor is inclined to change with temperature under operating conditions. Therefore, the step to solve this problem is not sufficient. In other words, the ratio of currents (main and sense currents) flowing through the main and sense transistors changes with temperature, thereby causing sense voltage to change with temperature.

SUMMARY OF THE INVENTION

The present invention is intended to eliminate the above-mentioned drawbacks.

The first object of the present invention is to provide a transistor with a current detecting function which does not require an external resistance and thus causes no power loss.

A second object of the present invention is to provide a transistor with a current detecting function in which the sense voltage at the both ends of a sense resistance does not change with temperature, so that the sense voltages always corresponds accurately to the magnitude of the main current.

A third object of the present invention is to provide a transistor with a current detecting function in which the ratio of main and sense currents does not change with temperature, so that the sense voltages always corresponds accurately to the main current.

A transistor provided with a current detecting function according to the present invention is designed to use a part of the electrode wiring through which main current flows as a current detecting resistance and to detect the magnitude of main current on the basis of the voltage drop across a resistance. Because the electrode wiring includes a resistance component, a part of it can be used as the resistance. In other words, voltage drop which corresponds to the magnitude of the main current can be obtained from both ends of that part of the electrode wiring which is used as the resistance. The magnitude of main current can therefore be detected on the basis of this voltage drop. As described above, the present invention uses the voltage drop of the resistance component which is present in the electrode wiring to detect current. This makes it unnecessary to add the external resistance to the transistor and prevents power loss.

Another transistor provided with a current detecting function according to the present invention is designed to include a main transistor through which main current flows, and a sense transistor for detecting the current flowing through the main transistor, wherein one resistor having a positive temperature coefficient and another resistor having a negative temperature coefficient are connected in series to an emitter of the sense transistor, and wherein the temperature coefficients and resistances of these resistors are set such that both are temperature-compensated to make their combined temperature coefficient of resistance zero.

The sense resistance comprises two resistors connected in series, one having a positive temperature coefficient and the other having a negative temperature coefficient. When the resistance of one of these resistors increases with temperature, the resistance of the other decreases. The changing voltage drops caused by the two resistors in response to temperature change cancel each other out, thus making the resultant voltage drop zero. Unless the main current changes in magnitude, therefore, the sense voltages can be kept almost constant, regardless of temperature change.

A further transistor provided with current detecting function according to the present invention includes a resistor having a temperature coefficient which maintains the ratio of main current to sense current constant regardless of temperature change, and another resistor having an appropriate temperature characteristic, wherein the two resistors are connected in series and then connected to the emitter of the sense transistor.

The resistor having a temperature characteristic compatible with that of the on-resistance between the collector and the emitter of the transistor is connected to the emitter of the sense transistor. Therefore, the ratio of main and sense currents, which naturally changes with temperature, can be maintained constant.

DETAILED DESCRIPTION OF THE PREFERRED EMBODIMENTS

Figure 1:
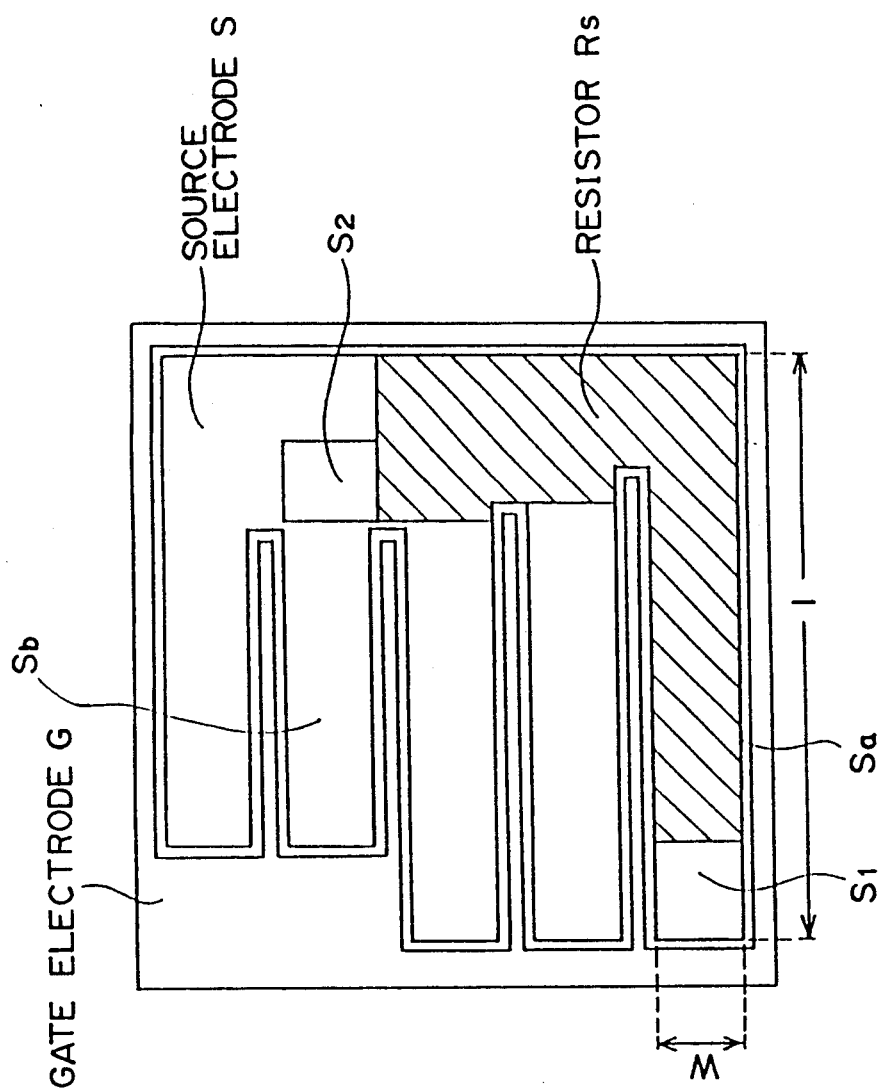
FIG. 1 is a plan showing an electrode pattern on the top of an example of the transistor provided with a current detecting function according to the present invention.

FIG. 1 is a plan showing the electrode pattern on the top of an example of a transistor provided with a current detecting function according to the present invention. This example is the well known bipolar electrostatic induction transistor of the multiemitter type to which a current detecting function is added.

In this example, a source electrode S made of aluminum or the like and having portions shaped like the teeth of a comb, as shown in FIG. 1, is formed on plural source regions (not shown) which are arranged side by side on the surface of a chip. Similarly, a gate electrode G made of aluminum or the like and having portions shaped like the teeth of a comb is formed on a gate region (not shown) which encloses the source regions. The portions of the source electrode S which are shaped like the teeth of a comb are alternately engaged with those portions of the gate electrode G which are also shaped like the teeth of a comb. Although not shown in FIG. 1, a drain electrode D is formed all over the underside (or drain region) of the chip.

Figure 2:
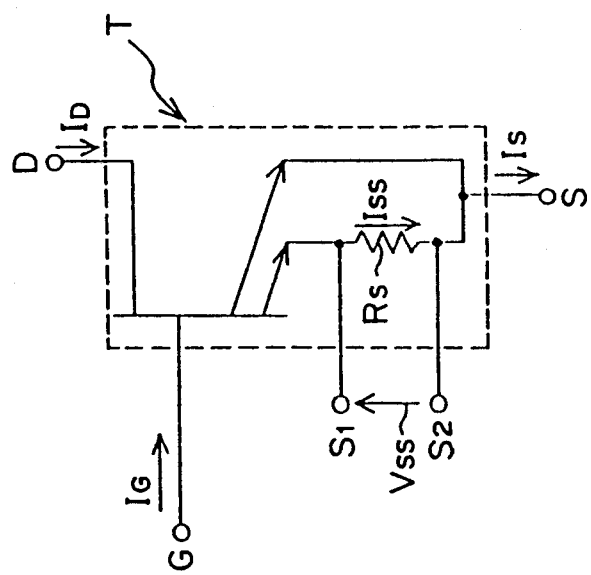
FIG. 2 is a circuit diagram of the transistor.

A current detecting terminal $S_1$ is located at the front end of one of the teeth-like portions $S_a$ of the source electrode S and another current detecting terminal $S_2$ is located at the base of another toothlike portion $S_b$, which is separated from the electrode portion $S_a$. That portion (the hatched portion) of the source electrode S which is extended between the two terminals $S_1$ and $S_2$ is used as a resistance $R_S$. FIG. 2 schematically shows a circuit diagram of the transistor which is arranged as described above. In this case, however, the transistor is of the n-channel electrostatic induction type.

In the transistor according to the present invention, arranged as described above, drain current $I_D$ flows through the drain electrode D while source current $I_S$ ($\approx$ drain current $I_D$) flows through the source electrode S in response to gate current $I_G$ flowing through the gate electrode G. Current (or detecting current) $I_{SS}$ flows this time through the current-detecting resistance $R_S$, which is a part of the source electrode S, from terminal $S_1$ to terminal $S_2$. When voltage drop caused by the resistance RS or voltage $V_{SS}$ between the terminals $S_1$ and $S_2$ is measured, therefore, the magnitude of main current (or source current $I_S$) can be detected.

According to this example of the transistor, current detection can be achieved using the voltage drop of the resistance component which is present in the source electrode S, as described above. This makes it unnecessary to add an external resistance to the transistor. This also makes zero the current loss occurring when current is detected.

When the terminal $S_1$ is located at the front end of electrode portion $S_a$ and the terminal $S_2$ is located at the base of the other electrode portion $S_b$ as in this example, current flows to terminal $S_2$ not only from electrode portion $S_a$ but also from those electrode portions located between electrode portions $S_a$ and $S_b$, and voltage drop across all of these electrode portions can be detected as the voltage drop across resistance $R_S$. In other words, the voltage drop can be detected as a voltage high enough to be unaffected by any noise. Even if the material of which the source electrode S is made is aluminum, which has low resistivity, for example, the resistance can be made to be about 0.1Ω when the width w and length l of each of the electrode portions which are a part of the source electrode S are appropriately set. In a case where a source current of several tens of amps is allowed to flow, therefore, a voltage drop of about 100 mV can be detected with the resistance $R_S$.

Figure 3:
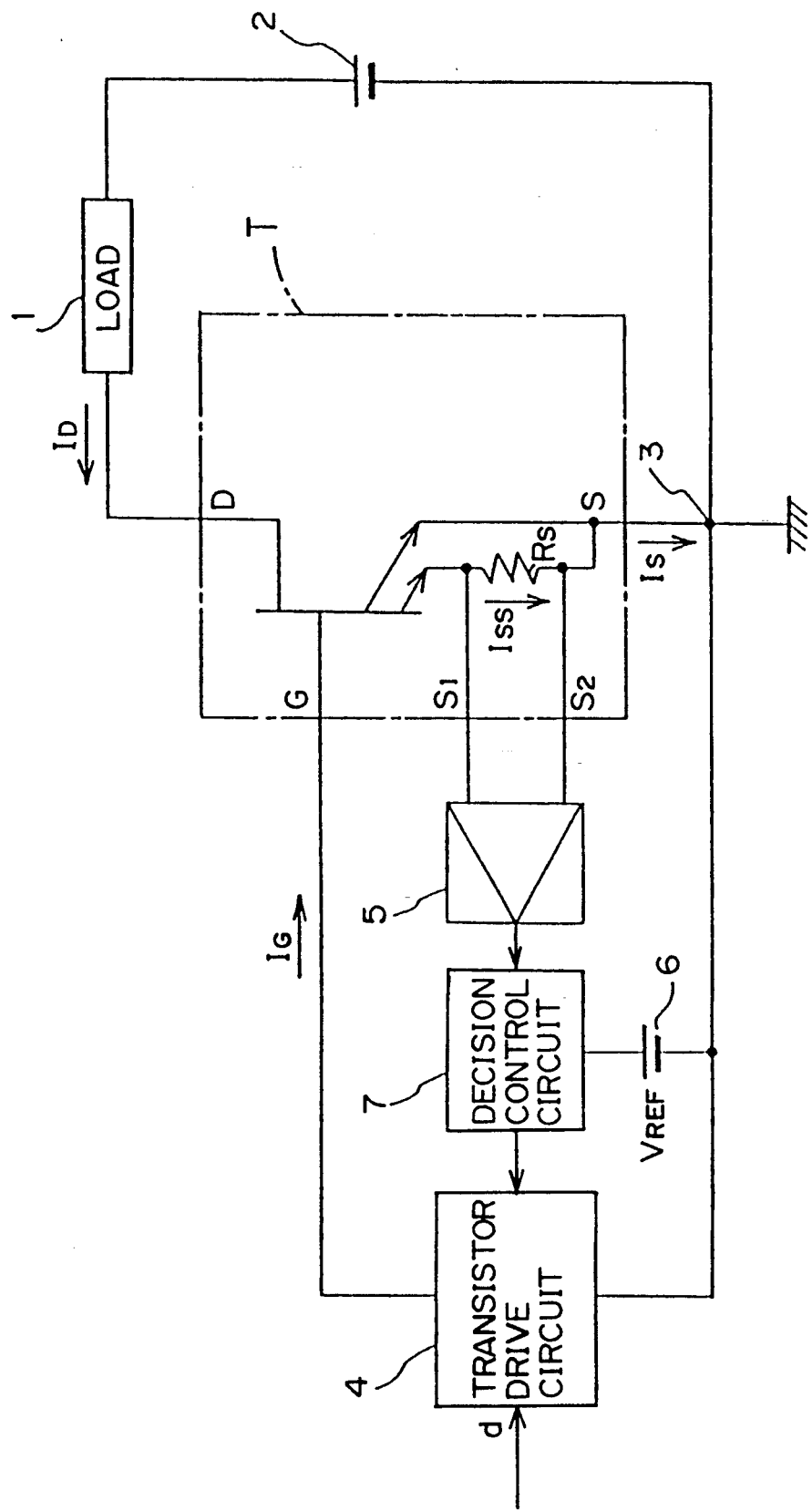
FIG. 3 is a block diagram showing an example of the excess current protection circuit into which the transistor is incorporated.
Figure 4:
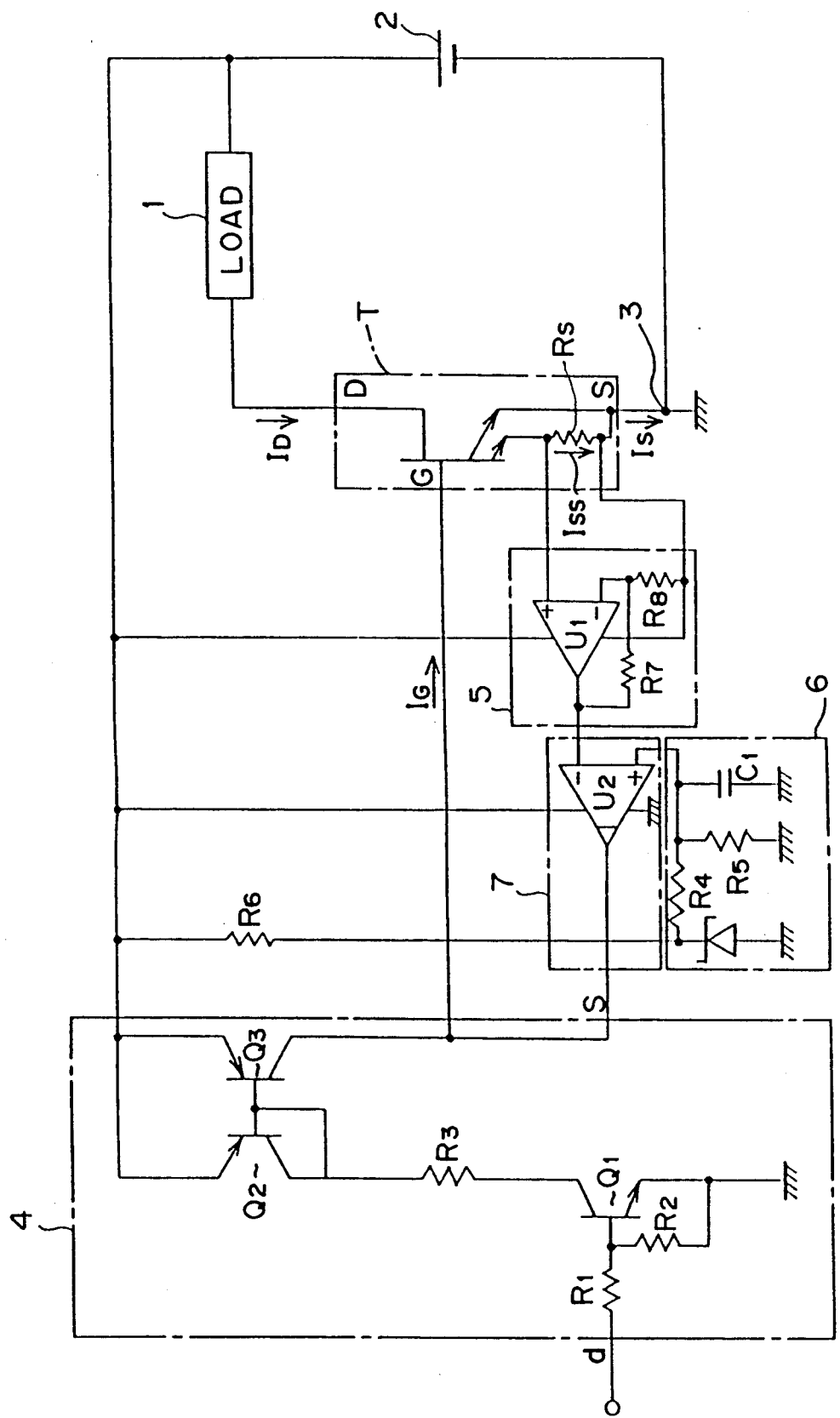
FIG. 4 is a circuit diagram showing in more detail the circuit shown in FIG. 3.

FIG. 3 is a block diagram showing an example of a circuit for protecting a transistor T from excess current, said transistor T being provided with a current detecting function, as described above, according to the present invention. FIG. 4 shows in more detail the circuit shown in FIG. 3.

In FIG. 3, the drain electrode D of the transistor T is connected to the plus side of a DC power source 2 through a load 1 and the source electrode S thereof to the minus side of the DC power source 2 through a common terminal 3. It is also arranged such that gate current $I_G$ flows from a transistor drive circuit 4 to the gate electrode G.

Further, voltages created at both ends of the current detecting resistance $R_S$ of the transistor T are applied to a DC amplifier 5 where they are amplified. Voltage thus obtained is then applied to a decision control circuit 7 together with reference voltage $V_{REF}$ of a reference voltage source 6. Voltage resulting from the decision of decision control circuit 7 is supplied as control input to transistor drive circuit 4. As is apparent from FIG. 4, the DC amplifier 5 is an operational one with a single power source, the decision control circuit 7 is a comparator of the open collector output type and the reference voltage source 6 comprises a Zener diode, resistors and a capacitor. The transistor drive circuit 4 comprises an amplifier circuit including a transistor $Q_1$ and a current mirror circuit including transistors $Q_2$ and $Q_3$.

The operation of the excess current protection circuit which has the above-described arrangement is described below.

When a drive signal is applied to a drive input terminal d of the transistor drive circuit 4, the transistor drive circuit 4 supplies gate current $I_G$ to the gate electrode G of the transistor T. As a result, the transistor T is made conductive, allowing source current $I_S$ ($\approx$ drain current $I_D$) to flow through the load 1. Detecting current $I_{SS}$, which is a part of source current $I_S$, flows this time to the current detecting resistance $R_S$. A voltage which corresponds to the magnitude of source current $I_S$ is thus caused between both ends of the resistance $R_S$ and amplified by K (a constant) times.

The output voltage of a DC amplifier 5 is applied to decision control circuit 7 and compared there with reference voltage $V_{REF}$. If the load 1 is shortcircuited, thereby making source current $I_S$ excessive and output voltage of the DC amplifier 5 higher than reference voltage $V_{REF}$, decision control circuit 7 applies a control signal to a control terminal s of the transistor drive circuit 4. As a result, the transistor drive circuit 4 cuts down the supply of gate current $I_G$ to the transistor T to reduce source current $I_S$ (=drain current $I_D$). This negative feedback loop protects the transistor T, load 1 and DC power source 2 from excess current.

Current detecting terminals $S_1$ and $S_2$ do not need to be located as shown in FIG. 1. They may be located at any position if a voltage drop large enough to detect current can be created by the resistance $R_S$ which is formed between them.

The material of the electrode is not limited to aluminum, but may be of another metal, of polysilicon, or the like.

Although an electrostatic induction transistor of the n-channel type is shown in FIG. 2, it may be of the p-channel type. Or the present invention can be applied to the bipolar transistor, a field-effect transistor, or the like.

Figure 5:
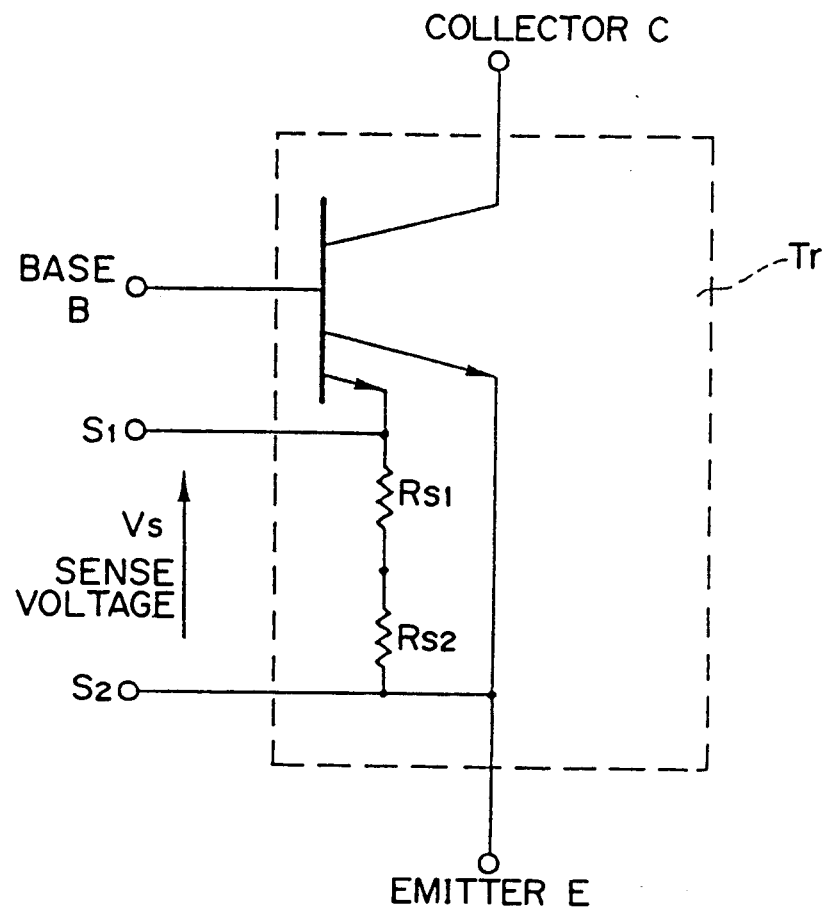
FIG. 5 is a circuit diagram showing an arrangement of the transistor provided with current detecting function according to the present invention.

FIG. 5 schematically shows another arrangement of the transistor provided with a current detecting function according to the present invention.

A transistor Tr provided with a current detecting function includes a main transistor section through which main current flows, and a sense transistor section for detecting current flowing through the main transistor section. The collector and base of both transistor sections are commonly connected to each other and separately extended outside the transistor package which is shown by a broken line (see symbols C and B). An emitter or main emitter of the main transistor section is also extended outside the transistor package (see symbol E), as for the collector and base.

A sense resistance comprises resistances $R_{S1}$ and $R_{S2}$ connected in series. $R_{S1}$ has a positive temperature coefficient and resistance $R_{S2}$ has a negative temperature coefficient. One end of the sense resistance is connected to the emitter or sense emitter of the sense transistor section, while the other end is connected to the main emitter. The junction of the sense emitter with the sense resistance $R_{S1}$ is extended outside the transistor Tr as one terminal $S_1$ of the sense voltage detecting terminals, while the junction of the main emitter with the sense resistance $R_{S2}$ outside the transistor Tr as the other terminal $S_2$ thereof. In this example, resistance $R_{S1}$ has a positive temperature coefficient and the resistance $R_{S2}$ has a negative temperature coefficient, but the same function can be achieved even if the resistance $R_{S1}$ has a negative temperature coefficient and the resistance $R_{S2}$ has a positive temperature coefficient.

Conditions under which the combined resistance of sense resistances $R_{S1}$ and $R_{S2}$ becomes certain regardless of temperature change are described below.

When the sense resistances are represented by $R_{S0}$, $$R_{S0} = R_{S1} + R_{S2} \tag{1}$$

When equation (1) is further expressed, taking temperature change into consideration, $$R_{S0} = R_{S1}(1+\alpha_{K1}\Delta T) + R_{S2}(1+\alpha_{K2}\Delta T) \tag{2}$$

wherein $\alpha_{K1}$ represents a temperature coefficient of the resistance $R_{S1}$ ($\alpha_{K1} > 0$), $\alpha_{K2}$ is a temperature coefficient of the resistance $R_{S2}$ ($\alpha_{K2} < 0$) and $\Delta T$ is the value of temperature change.

The temperature-change term in equation (2) may become zero to keep the sense resistances $R_{S0}$ unaffected by temperature. Therefore, $$\alpha_{K1} \cdot \Delta T \cdot R_{S1} + \alpha_{K2} \cdot \Delta T \cdot R_{S2} = 0 \tag{3}$$

Equations (1) and (3) are the conditions under which the combined resistance of the sense resistances becomes certain regardless of temperature change. When the temperature coefficients $\alpha_{K1}$, $\alpha_{K2}$ and resistances $R_{S1}$, $R_{S2}$ are set to comply with equation (3), therefore, the sense resistances are unaffected by temperature change.

Figure 6:
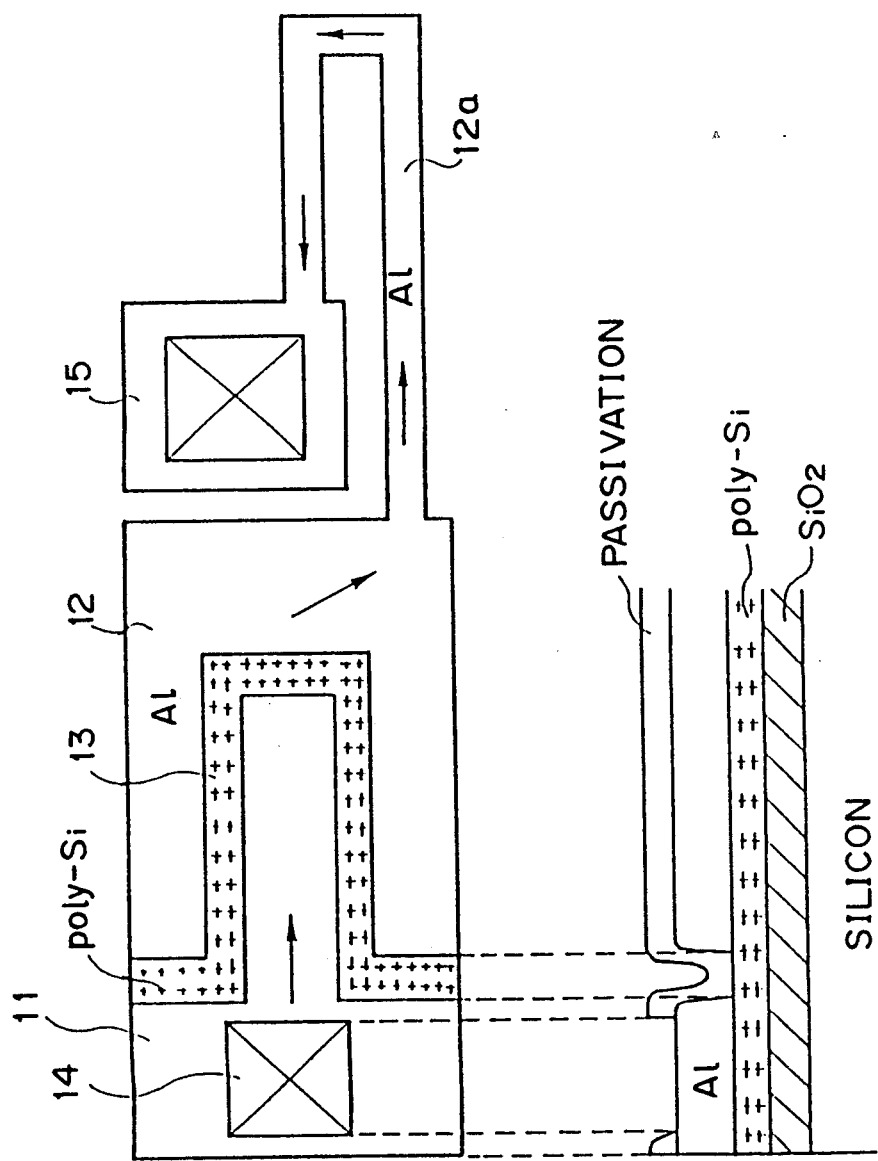
FIG. 6 shows a concrete example of a sense resistance in a transistor provided with a current detecting function, in which plane and sectional arrangements are shown for comparison.

FIG. 6 shows plane and sectional arrangements of the transistor provided with a current detecting function to describe a concrete example of the sense resistances.

A layer of polysilicon (which has a negative temperature coefficient) is formed on the surface of a silicon oxide ($SiO_2$) substrate and a layer of aluminum (which has a positive temperature coefficient) is formed on some necessary areas on the layer of polysilicon (Poly-Si). An electrode 11 and another electrode 12 which has a resistance area 12a are formed of the layer of aluminum (Al). A stripe of polysilicon 13 is interposed between the electrodes 11 and 12.

A pad 14 extending to the sense emitter and the sense voltage detecting terminal ($S_1$) is connected to the electrode 11 and current flowing from pad 14 passes through electrode 11, stripe 13 and electrode 12 and flows to a pad 15, to which the sense voltage detecting terminal ($S_2$) extends, through the resistance area 12a.

The whole of the electrodes 11 and 12 are made of aluminum and, together with the resistance area 12a, function as a resistance $R_{S1}$ and the stripe of polysilicon 13 functions as the resistance $R_{S2}$. The present invention has been applied to the common transistor in this example, but it can be applied to the FET, the electrostatic induction transistor and the like and it is well known in this case that the collector is regarded as drain, the emitter as a base and the base as a gate.

Figure 7:
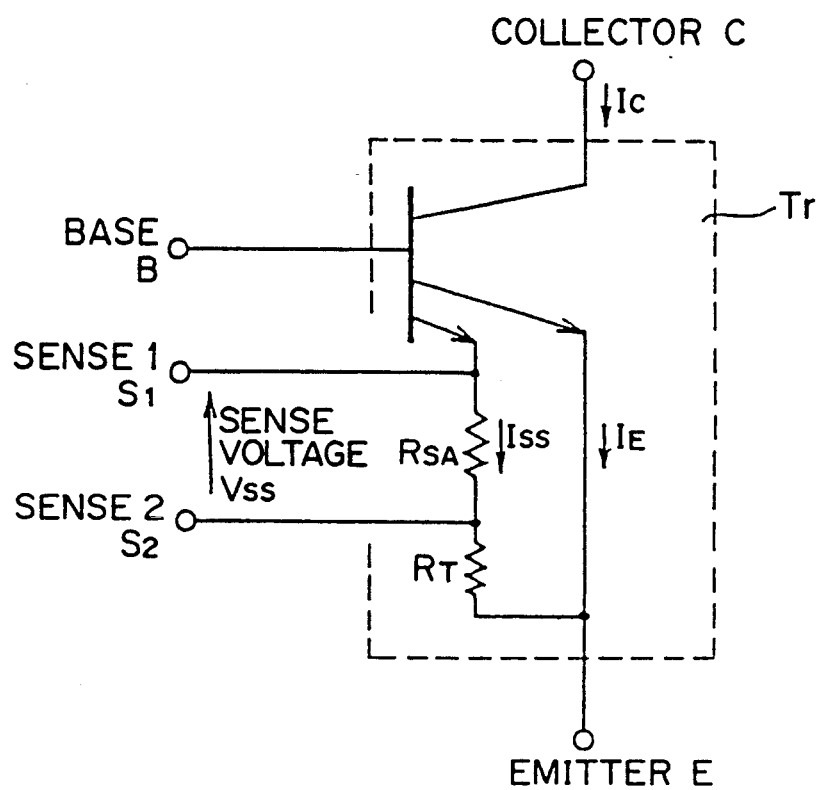
FIG. 7 is a circuit diagram showing an arrangement of a transistor provided with a current detecting function according to the present invention.

FIG. 7 schematically shows a further arrangement of the transistor provided with a current detecting function according to the present invention.

A transistor Tr provided with a current detecting function includes a main transistor section through which main current flows, and a sense transistor section for detecting the current flowing through the main transistor section. The collector and base of both transistor sections are commonly connected and separately extended outside the transistor which is enclosed by a broken line (see symbols C and B). The emitter or main emitter of the main transistor section is also extended outside the transistor Tr, as for the collector and base (see symbol E).

An emitter or sense emitter of the sense transistor section is connected to the main emitter through a sense resistance $R_{SA}$ whose temperature coefficient is compensated to make it zero and a resistance $R_T$ which has a temperature coefficient suitable for making the ratio of main current and sense current (which flows to the sense transistor section) constant with temperature change. The junction of the sense emitter with the sense resistance $R_{SA}$ extends outside the transistor Tr as one sense voltage detecting terminal ($S_1$), while the junction of the sense resistance $R_{SA}$ with the resistance $R_T$ extends outside the transistor Tr as the other sense voltage detecting terminal ($S_2$).

In this example, the sense resistance $R_{SA}$ and the resistance $R_T$ are formed on the silicon substrate as a combination of the resistance (which has a positive temperature coefficient) of the aluminum electrode formed together with the transistor section and the diffusion resistance (which has a negative temperature coefficient) of polysilicon formed according to the diffusion manner.

The condition under which the ratio of main and sense currents remains constant with temperature change is described below.

Figure 8:
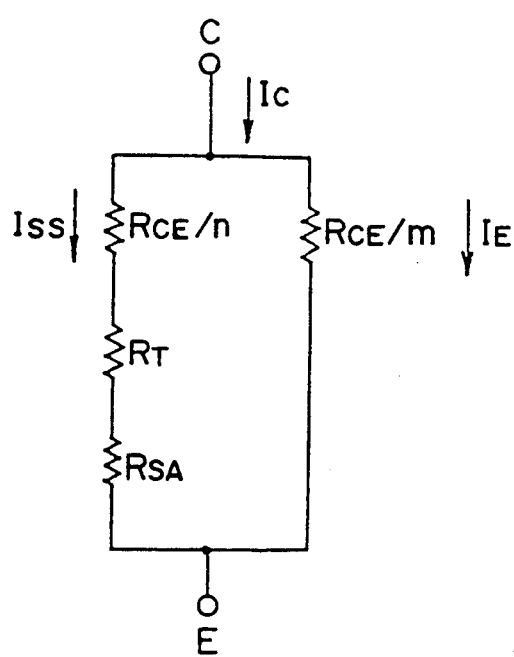
FIG. 8 is a circuit diagram showing an arrangement of an equivalent circuit of a transistor provided with a current detecting function.

FIG. 8 shows an equivalent circuit of the transistor Tr provided with a current detecting function.

In FIG. 8, an on-resistance between the collector and the emitter of the main transistor section is denoted by $R_{CE}/m$ and and on-resistance between the collector and the sense emitter of the sense transistor section by $R_{CE}/n$. The resistance $R_T$ and the sense resistance $R_{SA}$ are connected in series to the on-resistance between the collector and the sense emitter and then to the main emitter. Providing that current flowing to the sense transistor section is denoted by $I_{SS}$ and that current flowing to the main transistor section by $I_E$, the ratio of these currents $I_{SS}$ and $I_E$ can be expressed as follows:

$$I_{SS}/I_E = \{(1 + \alpha_K \Delta T) R_{CE}/m\}/\{(1 + \alpha_K \Delta T) R_{CE}/n + R_{SA} + (1 + \alpha_T \Delta T) R_T\} = \{R_{CE}/m\}/\{R_{CE}/n\} + [R_{SA} + (1 + \alpha_T \Delta T) R_T]/(1 + \alpha_K \Delta T)$$ (4)

where $\alpha_K$ represents the temperature coefficient of the on-resistance $R_{CE}$ of that semiconductor which forms the transistor Tr provided with current detecting function, $\alpha_T$ the temperature coefficient of the resistance $R_T$, $\Delta T$ the temperature change and m and n positive integers.

If the ratio is not affected by temperature change, $\Delta T$ becomes zero. When $\Delta T$ is replaced by zero in the equation (4), $$I_{SS}/I_E = \{R_{CE}/m\}/\{R_{CE}/n + R_{SA} + R_T\}$$ (5)

The condition under which the ratio of currents $I_{SS}$ and $I_E$ remains constant with temperature change is given as follows from the equations (4) and (5):

$$R_{SA} + R_T = \frac{R_{SA} + (1 + \alpha_T \Delta T) R_T}{1 + \alpha_K \Delta T}$$ (6)

From the equation (6), $$R_T = \frac{\alpha_K}{\alpha_T - \alpha_K} \cdot R_{SA}$$ (7)

Equation (7) describes the condition under which the ratio currents $I_{SS}$ to current $I_E$ remains constant. When the temperature compensating resistance $R_T$ given by equation (7) is added to the sense emitter, therefore, the ratio of current $I_{SS}$ to current $I_E$ remains constant. This can prevent sense voltage $V_{SS}$ from drifting in response to temperature change.

Figure 9:
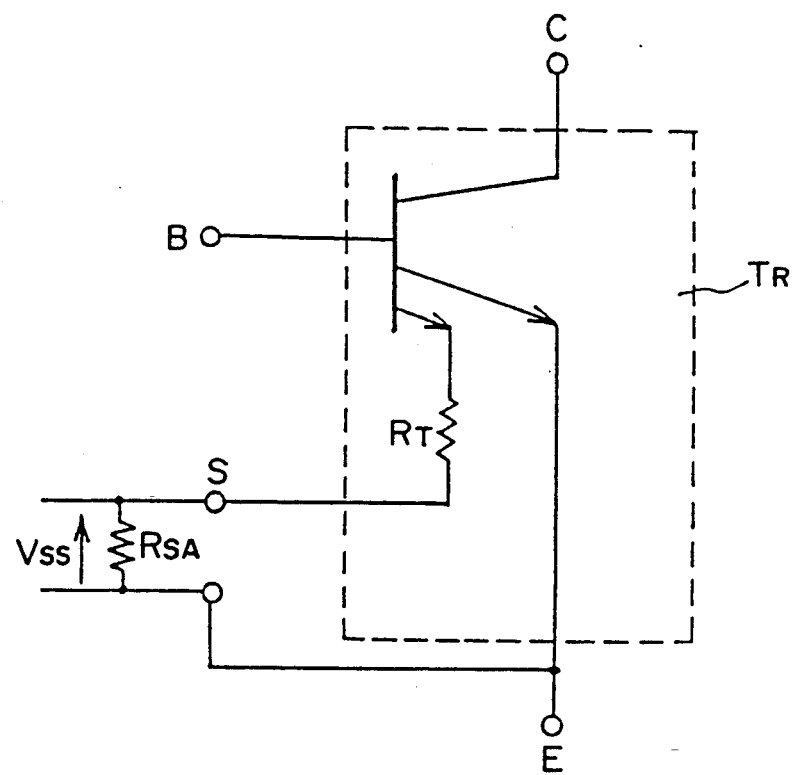
FIG. 9 is a circuit diagram showing another example of a transistor provided with a current detecting function according to the present invention.

FIG. 9 shows another example of a transistor provided with a current detecting function according to the present invention.

A collector C, a base B and a main emitter E of the transistor $T_R$ provided with current detecting function are arranged as shown in FIG. 1. The sense emitter extends, as a sense voltage detecting terminal S, outside the transistor $T_R$ through a resistance $R_T$ which has a temperature coefficient suitable for making the ratio of main and sense currents constant with temperature change. A sense resistance $R_{SA}$ having a temperature coefficient of zero is located between the sense voltage detecting terminal S and the main emitter E and outside the transistor $T_R$. Even in the case of the transistor $T_R$ provided with a current detecting function and having the above-described arrangement, sense voltage $V_{SS}$, which is hardly affected by temperature change, can be obtained from both ends of the sense resistance $R_{SA}$, as for the transistor shown in FIG. 7. Although the present invention has been applied to the common transistor in this case, it may be applied to the FET, the electrostatic induction transistor (SIT) and the like. It is well known in this case that the collector is regarded as a drain, the emitter as a source and the base as a gate.

According to the present invention as described in detail above, the main current is determined from the voltage drop of the resistance component which is present in the electrode wiring. This can provide a transistor with a current detecting function, which makes it unnecessary to add an external resistance to the transistor and which can prevent power loss.

Further, because the sense resistance is temperature-compensated, it hardly changes with temperature. This enables a transistor provided with current detecting function to be manufactured, said transistor being capable of obtaining a sense voltage which accurately corresponds to the magnitude of the main current. When excess current flows in the main transistor section, therefore, it can be detected accurately.

Still further, the ratio of main current to sense current can be made unaffected by temperature change and sense voltage can be thus obtained to accurately corerespond to the magnitude of main current regardless of temperature change. This enables a transistor provided with a current detecting function to be made to more accurately detect excess current.

What is claimed is:

1. A transistor circuit provided with a current detecting function comprising a transistor for driving a load, said transistor having at least one emitter, first and second resistances formed within said transistor, one resistance having a positive temperature coefficient of resistance and the other resistance a negative temperature coefficient of resistance, said resistances being serially connected in series with said one emitter, output terminals connected across at least one of said resistances, and said resistances being constructed with a combined temperature coefficient of resistance equal to substantially zero.

2. The transistor circuit according to claim 1 wherein said transistor is of the n-channel electrostatic induction type.

3. The transistor circuit according to claim 1 wherein said transistor is of the p-channel electrostatic induction type.

4. The transistor circuit according to claim 1 wherein said transistor is of the bipolar type.

5. The transistor circuit according to claim 1 wherein said transistor is of the field effect type.

6. The transistor circuit according to claim 1 wherein said resistance having a positive temperature coefficient of resistance is a part of an electrode wiring pattern made of aluminum.

7. The transistor circuit according to claim 6 wherein said transistor is of the n-channel electrostatic induction type.

8. The transistor circuit according to claim 6 wherein said transistor is of the p-channel electrostatic induction type.

9. The transistor circuit according to claim 6 wherein said transistor is of the bipolar type.

10. The transistor circuit according to claim 6 wherein said transistor is of the field effect type.

11. The transistor circuit according to claim 1 wherein said resistance having a negative temperature coefficient of resistance is a part of an electrode wiring pattern made of polysilicon.

12. The transistor circuit according to claim 11 wherein said transistor is of the n-channel electrostatic induction type.

13. The transistor circuit according to claim 11 wherein said transistor is of the p-channel electrostatic induction type.

14. The transistor circuit according to claim 11 wherein said transistor is of the bipolar type.

15. The transistor circuit according to claim 11 wherein said transistor is of the field effect type.

16. The transistor circuit according to claim 1 further including a DC amplifier for amplifying voltages appearing at said output terminals, a decision control circuit for comparing an output voltage from said DC amplifier with a reference voltage to decide which of them is higher, and a transistor driving circuit coupled to receive a control signal from said decision control circuit when said output voltage of the DC amplifier is higher than said reference voltage for limiting the current through said transistor.

17. The transistor circuit according to claim 16 wherein said DC amplifier is of the operational type, said decision control circuit is a comparator of the open collector output type, and said transistor driving circuit comprises an amplifier circuit including a transistor and a current mirror circuit including two transistors.

18. The transistor circuit according to claim 1 wherein said resistance having a positive temperature coefficient is formed by an electrode wiring pattern of aluminum and said resistance having a negative temperature coefficient is formed by an electrode wiring pattern of polysilicon.

19. A transistor circuit provided with a current detecting function comprising a transistor for driving a load, said transistor having at least one main current emitter, at least one sensing current emitter, and sensing current detecting and compensating means coupled to said sensing current emitter, said last mentioned means comprising first and second series connected resistors connected in series with said sensing current emitter, said resistors having temperature coefficients of resistance chosen and related for maintaining substantially constant with changing temperature the ratio of main current to sensing current, and means for obtaining an output from across at least one of said resistors.

20. The transistor circuit according to claim 19 wherein said resistors are each formed as a combination of aluminum and polysilicon to make their combined temperature coefficient of resistance zero.

21. The transistor circuit according to claim 20 wherein said resistors are located part within and part without said transistor.

* * * * *